United States Patent
Garrett

(10) Patent No.: US 7,400,688 B2
(45) Date of Patent: Jul. 15, 2008

(54) PATH METRIC NORMALIZATION

(75) Inventor: David Garrett, Pyrmont (AU)

(73) Assignee: Lucent Technologies Inc., Murray Hill, NJ (US)

(*) Notice: Subject to any disclaimer, the term of this patent is extended or adjusted under 35 U.S.C. 154(b) by 755 days.

(21) Appl. No.: 10/211,687

(22) Filed: Aug. 2, 2002

(65) Prior Publication Data

US 2003/0026347 A1 Feb. 6, 2003

(30) Foreign Application Priority Data

Aug. 3, 2001 (AU) .................... PR6792

(51) Int. Cl.
*H04L 5/12* (2006.01)
*H04L 23/02* (2006.01)

(52) U.S. Cl. .................... 375/265; 714/792; 714/796

(58) Field of Classification Search ............ 375/265, 375/341, 262, 350; 371/5.1, 43; 714/792, 714/795, 796
See application file for complete search history.

(56) References Cited

U.S. PATENT DOCUMENTS

| | | | | |
|---|---|---|---|---|
| 4,991,184 A * | 2/1991 | Hashimoto | ................ | 375/219 |
| 5,390,198 A * | 2/1995 | Higgins | ................ | 714/796 |
| 5,594,807 A * | 1/1997 | Liu | ................ | 382/128 |
| 5,715,470 A * | 2/1998 | Asano et al. | ................ | 375/341 |
| 5,838,392 A * | 11/1998 | Chen et al. | ................ | 348/699 |
| 5,841,796 A * | 11/1998 | Snyder, Jr. | ................ | 714/794 |
| 5,960,011 A * | 9/1999 | Oh | ................ | 714/789 |
| 6,072,845 A * | 6/2000 | Bond et al. | ................ | 375/350 |
| 6,108,374 A * | 8/2000 | Balachandran et al. | ...... | 375/227 |
| 6,128,763 A * | 10/2000 | LoGalbo et al. | ............ | 714/774 |
| 6,148,431 A * | 11/2000 | Lee et al. | ................ | 714/794 |
| 6,154,871 A * | 11/2000 | Claydon et al. | ............ | 714/795 |
| 6,178,538 B1 * | 1/2001 | Fukahori | ................ | 714/795 |
| 6,205,187 B1 * | 3/2001 | Westfall | ................ | 375/265 |
| 6,215,827 B1 * | 4/2001 | Balachandran et al. | ...... | 375/262 |
| 6,785,353 B1 * | 8/2004 | Zakrzewski | ................ | 375/357 |
| 6,961,391 B2 * | 11/2005 | Chen | ................ | 375/341 |
| 6,999,531 B2 * | 2/2006 | Jin | ................ | 375/341 |
| 2002/0029362 A1 * | 3/2002 | Stephen et al. | ............ | 714/752 |
| 2002/0061070 A1 * | 5/2002 | Cameron et al. | ............ | 375/265 |
| 2002/0141506 A1 * | 10/2002 | Chen | ................ | 375/262 |
| 2003/0108128 A1 * | 6/2003 | Hattori et al. | ................ | 375/341 |

* cited by examiner

*Primary Examiner*—Jean B Corrielus

(57) ABSTRACT

Path metric normalization in calculating trellis-based algorithms is improved by normalizing the path metric with an average value (rather than a maximum or a minimum) of the path metrics. Using an average rather than a maximum or a minimum provides various advantages without adversely affecting the execution of the trellis-based algorithm. Due to the relatively faster computation time available when an average is computed, average value normalization can be applied every cycle, because its critical path is less than that of the ACS unit.

11 Claims, 10 Drawing Sheets

| A | B | C | Carry | Sum |
|---|---|---|-------|-----|
| 0 | 0 | 0 | 0 | 0 |
| 0 | 0 | 1 | 0 | 1 |
| 0 | 1 | 0 | 0 | 1 |
| 0 | 1 | 1 | 1 | 0 |
| 1 | 0 | 0 | 0 | 1 |
| 1 | 0 | 1 | 1 | 0 |
| 1 | 1 | 0 | 1 | 0 |
| 1 | 1 | 1 | 1 | 1 |

FIG. 4B
(Prior Art)

PATH METRIC NORMALIZATION

CROSS-REFERENCE TO RELATED APPLICATION

This application claims priority of Australian Provisional Application No. PR6792, which filed on Aug. 3, 2001.

BACKGROUND OF THE INVENTION

I. Field of the Invention

The present invention relates to communications systems, and particularly to path metric normalization.

II. Description of the Related Art

A major portion of the processing power for third generation wireless communications revolves around trellis-based ("butterfly") algorithms, such as the log domain maximum a posteriori (logMAP) algorithm or the Viterbi algorithm (VA).

A hardware component of any trellis-based algorithm processor is the add-compare-select (ACS) unit, which approximates trellis state probability calculations in the log domain. In use, the ACS unit has two competing input paths, and operates to select the maximum of these two inputs. In the case of the logMAP algorithm, the ACS unit applies a corrective factor based on the difference of the incoming paths. Two ACS units are typically combined together to create a trellis "butterfly" arrangement, which calculates the path metrics for two new states based on two previous states. The path metrics represent a measure of the probability of a particular state based on the past. received symbols.

Normalization of the path metrics in the ACS butterfly for trellis-based algorithms is performed to prevent overflow and to limit the dynamic range of the variables. Normalization is performed by determining the maximum or minimum path metric across all the states, and then, in the next cycle, that value is subtracted from all the states to limit the "growth" of the path metrics, for the reasons noted directly above.

The trellis butterfly calculation forms the critical execution path for trellis algorithms, i.e., it is the trellis butterfly calculation that limits the maximum speed of the algorithm, and thus the speed of execution of the trellis butterfly calculation dictates overall performance. Consequently, every effort spent on optimizing the ACS unit translates directly to performance gains in the trellis algorithm processing.

However, existing normalization techniques are not universally satisfactory. Current practice is to normalize the path metrics with a value computed as the maximum or minimum value of all the path metrics. In existing implementations, the maximum or minimum is calculated using a comparator tree to isolate the maximum or minimum value among the many states. This can be quite costly in terms of computational delay, as a comparator produces a delay similar to that of an adder.

SUMMARY OF THE INVENTION

The present invention involves a recognition that normalization of path metrics in a trellis processing apparatus can be advantageously improved by normalizing the path metric with an average value of the path metrics for all states, rather than a calculated maximum or a minimum value. Using an average rather than a maximum or a minimum provides various advantages, such as speed of calculation, without adversely affecting the execution or results of the trellis-based algorithm.

Accordingly, in one aspect, the invention provides a method of trellis processing involving the use of path metric values in which the path metric values are normalized using a normalization value proportional to the average value of the path metrics. The invention also provides a trellis processing apparatus having a number of states and associated path metrics representative of the probability of a respective state based on past received symbols, in which the path metrics are normalized using a normalization value proportional to the average value of the path metrics, to limit the dynamic range and avoid overflow of calculated path metric values.

In a further aspect, the invention provides a circuit apparatus for determining a normalization value for use in telecommunications decoding in conjunction with an ACS processing unit, in which path metric input values are normalized with normalization values that are proportional to the average value of the path metrics.

Advantageously, a carry-save compressor tree is used to compute the average value of the path metrics and provides the sum in two components. The summation tree can be calculated much faster than a full tree comparator which the prior art has used to calculate a maximum or a minimum. As the normalization has no effect per se on the trellis-based algorithm, average value normalization can be substituted for maximum or minimum value normalization without adverse consequence.

Instead of using a comparator tree, the sum of all the path metrics can be computed, and then divided by the number of states. The number of states in the trellis is a value, which is a power of 2, e.g., 4, 8, 16, 32, .... Accordingly, a logical shift right can be used to compute the average value. The result is two normalization components that can be applied directly to the path metrics for normalization.

Advantageously, average value normalization can be applied every cycle of the ACS processing unit, because the critical path of the average value normalization is less than that of the ACS unit, and so the average value computation is completed more quickly than the ACS computation.

In one embodiment of the invention, the average normalization value, calculated using the carry-save compressor tree, is conveniently used with an ACS processing unit that also uses carry-save arithmetic. This avoids the need to resolve the sum and carry components of the calculated average value before use in ACS processing.

BRIEF DESCRIPTION OF THE DRAWINGS

The present invention will be better understood from reading the following description of non-limiting embodiments, with reference to the attached drawings, wherein below:

FIG. 4(*b*) is a truth table for the 3:2 compressor of FIG. 4(*a*);

FIG. 4(*c*) is a block diagram representing an implementation of a 4:2 compressor;

It should be emphasized that the drawings of the instant application are not to scale but are merely schematic representations, and thus are not intended to portray the specific dimensions of the invention, which may be determined by skilled artisans through examination of the disclosure herein.

DETAILED DESCRIPTION

The arrangements to be described relate to add-compare-select (ACS) processing units used in wireless communications hardware to calculate trellis-based algorithms, such as logMAP and Viterbi algorithms. However, prior to such being described, a description of trellis-based algorithms and their calculation using conventional ACS processing hardware and techniques is given directly below.

Overview of Trellis Algorithms

Figure 1:
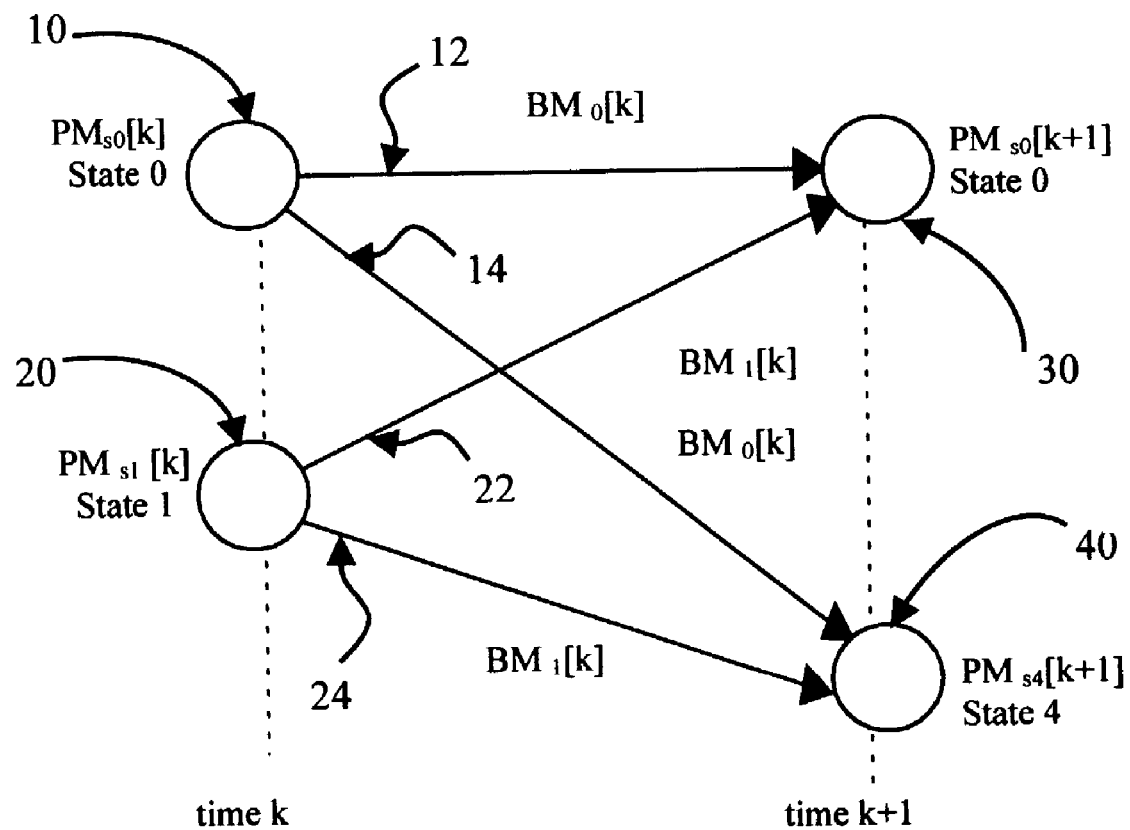
FIG. 1 is a representation of a portion of a trellis arrangement used in performing calculations for trellis-based algorithms.

A trellis butterfly calculation defines the interconnectivity between two states in a trellis at the present time (at time index k) and two states in the trellis in the next time period (time index k+1). FIG. 1. shows a portion of a trellis that illustrates a single butterfly. Two input states 10 and 20, at time k, connect to a corresponding pair of states, 30 and 40, at time k+1, via opposing pairs of paths 12, 14 and 22, 24, respectively and their associated branch metrics. Input state 10 corresponds to a path metric for state 0 at time k, and has two branch metrics 12 and 14, corresponding to input symbols 0 and 1, respectively. A path metric is a measure of the probability of a particular state based on past received symbols, while each branch metric reflects the probability that a current path between two states is correct.

The branch metrics 12, 14 connect the input state 10 to possible states in the trellis at time k+1. Branch metric 12 terminates at next state 30, being the path metric for state 0 at time k+1. Branch metric 14 terminates at next state 40, being the path metric for state 4 at time k+1. Similarly, input state 20 corresponds to a path metric for state 1 at time k and has branch metrics 22 and 24, corresponding to input symbols of 0 and 1, respectively. Branch metric 22 terminates at next state 30 and branch metric 24 terminates at next state 40, at time k+1. Thus, for any given path metric at time k, there are two possible branch metrics, corresponding to input symbols of 0 and 1, leading to two possible new states at time k+1. Moreover, pairs of input states at time k are connected to corresponding pairs of states at time k+1 by opposing branch metrics, demonstrating the symmetry of the trellis.

Conventional ACS Processing Unit

The ACS unit performs a log approximation, and hardware implementations of the logMAP algorithm use a lookup table to add a corrective factor, based on the difference of the incoming path metrics, to compensate for the maximum approximation. The operation can be summarized in the following equation, which adopts nomenclature consistent with that used in FIG. 1 and in which $PM_{sx}$ represents the path metric for state x and $BM_y$ represents the branch metric for path y (either path 0 or 1) at time index k:

$$x_1 = PM_{s0}[k] + BM_0[k] \text{ and } x_2 = PM_{s1}[k] + BM_1[k]$$

$$PM_{sx}[k+1] = \max[x_1, x_2] + f[|x_1 - x_2|]$$

Figure 2:
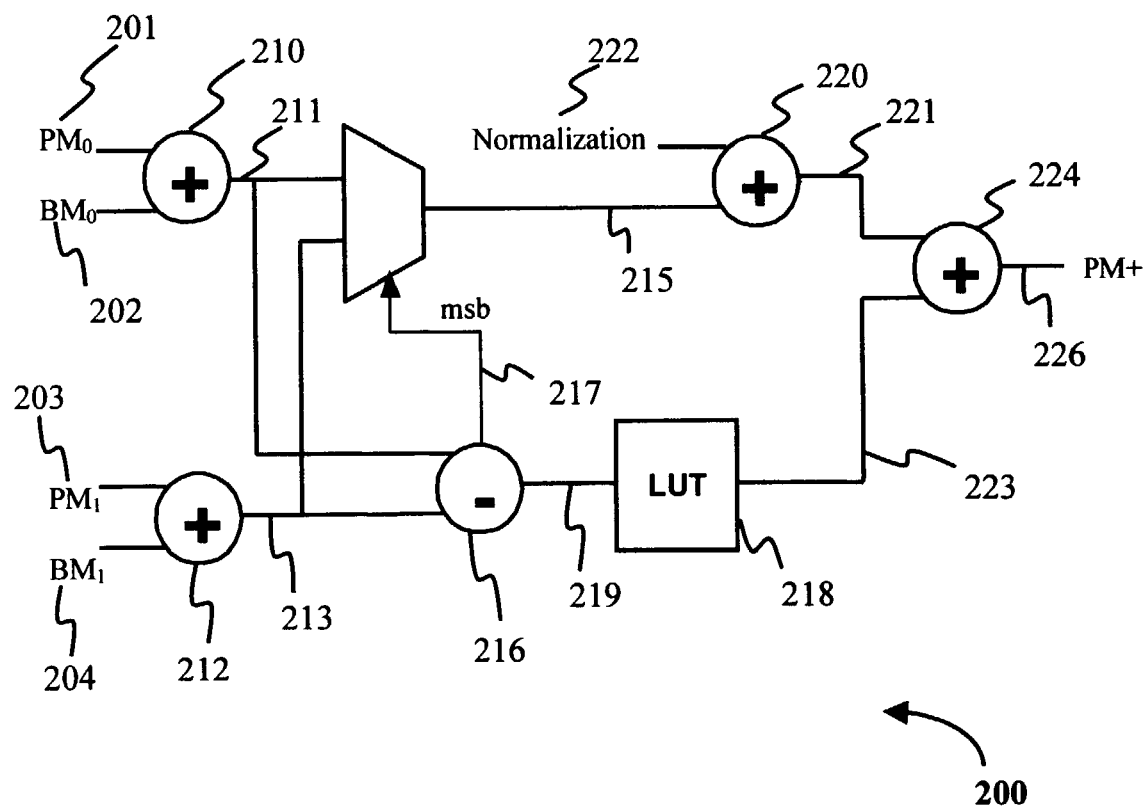
FIG. 2 is a block diagram representation of a conventional add-compare-select (ACS) processing unit.

FIG. 2 is a schematic block diagram for a conventional prior art ACS unit 200. In this respect, a conventional method of processing calculations using the ACS unit 200 of FIG. 2 for butterfly processing follows directly from the equations specified directly above.

Initially, two competing paths are computed from the previous path metrics and the current branch metrics using an adder circuit. There are many techniques to accelerate the addition process such as carry-look-ahead adders and prefix adders, but the propagation delay still depends on fully propagating the carry to compute the final result.

For a given time period, path metric-0 $PM_0$ 201 and a corresponding branch metric-0 $BM_0$ 202 are presented to a first adder 210 to produce a first competing path 211. Similarly, path metric-1 $PM_1$ 203 and corresponding branch metric-1 $BM_1$ 204 are presented to a second adder 212 to produce a second competing path 213. The competing paths 211 and 213 are presented to each of a multiplexer 214 and a subtractor 216. The two competing paths 211, 213 are subtracted to determine which of the two competing paths is the maximum path metric value.

Accordingly, the subtractor 216 produces a most significant bit (msb) 217, which represents the sign of the difference between the two competing path metrics 211, 213 and, thus, which of the two competing path metrics is greater. The most significant bit (msb) 217 is presented as a select bit to the multiplexer 214, and the greater of the two competing path metrics is output from the multiplexer 214 as the maximum path metric 215.

The subtractor 216 also produces the difference 219, which is presented to a lookup table (LUT) 218. The LUT 218 uses the difference 219 to produce a corrective term or factor 223.

The maximum path metric 215 is presented to a third adder 220, which also receives an external normalization factor 222. The normalization factor 222 and the maximum path metric 215 are added to ensure that the maximum value 215 remains within the dynamic range of the conventional ACS unit 200. The third adder 220 produces a normalized output 221, which is added to the corrective factor 223 using a fourth adder 224. The fourth adder 224 produces an output, which is the new path metric PM+ 226 for the next time period.

The critical calculation pipeline for such an algorithm is formed from at least 4 adders in series, or 3 adders and a look-up table (LUT), depending on the propagation delay of the LUT.

From the above description of the conventional ACS unit 200, it is noted that path metric values tend to grow continuously with recursive ACS processing, and the dynamic range of the path metric variables can grow quite large even for moderate size blocks. However, it is recognized that the values of the path metrics only have meaning relative to the other states within the same time index, so a normalization term can be applied to prevent the path metrics from growing too large, and thus causing overflow when calculating or storing these values. The dynamic range of the path metric values is quantized to only handle a small block of trellis providing the normalization factor is equally applied to all states to periodically reduce the magnitudes of the path metric values.

As noted above, normalization of the path metrics in a trellis algorithm is done to prevent overflow and to limit the dynamic range of the variables. Conventionally, either the maximum or minimum path metric is found across all the states, and then in the next cycle that value is used as the normalization correction factor 222 and subtracted from all the states as discussed above in relation to FIG. 2 to limit how much the path metrics grow.

Figures 3A, 3B:
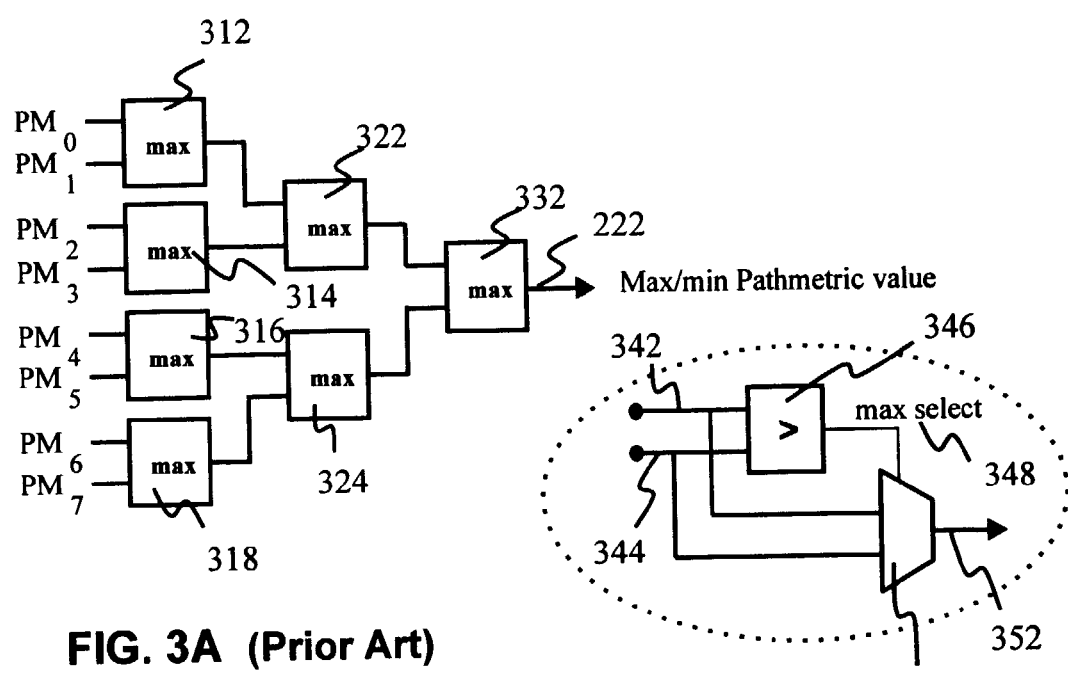
FIGS. 3(*a*) and 3(*b*) are representations a maximum/minimum normalization circuits, used in conjunction with the conventional ACS processing unit illustrated in FIG. 2, for performing normalization operations in accordance with conventional techniques.

The conventional operation of computing the maximum or minimum value is illustrated in the maximum/minimum normalization circuit, shown in FIGS. 3(a) and 3(b). A comparator tree 300 involves a cascaded series of maximum selecting blocks 312 to 332 as illustrated in FIG. 3(a). Each of the maximum selecting blocks 312 to 332 is as shown within the dashed ellipsoidal line. The maximum selecting blocks 312 to 332 accept two path metric inputs, 342 and 344.

In an illustrative example of normalization correction, shown in FIG. 3(b), adjacent pairs of the path metrics $PM_0$ to $PM_7$ are input to the maximum as inputs 342 and 344. A comparator block 346 determines which value 342 or 344 is greater. A resulting signal 348 is input to multiplexer 352, which also accepts as input the two path metric inputs 342 and 344 and passes the maximum value through as output maximum value 352, depending on the input from the signal 348. The maximum value 352 is equivalent to the signal 222 of FIG. 3(a).

As pairs of path metric values are successively compared, a maximum or minimum global to the input path metrics $PM_0$ to $PM_7$ is eventually determined, and used in the conventional ACS unit 200 as the normalization corrective factor 222.

In a high-speed implementation, computing the maximum or minimum value in the manner shown in FIGS. 3(a) and 3(b) requires a comparator tree 300, the operation of which can be relatively costly in terms of computational delay in eventually determining the value to be used as the normalization factor 222 for use in the conventional ACS unit 200.

Carry-Save Arithmetic

Carry-save arithmetic is used in an implementation of the normalization value calculation for ACS processing, as described below in further detail. Carry-save arithmetic is an existing technique in which a result is presented as separate carry and sum components, rather than the more conventional single number resolved output.

Figure 4A:
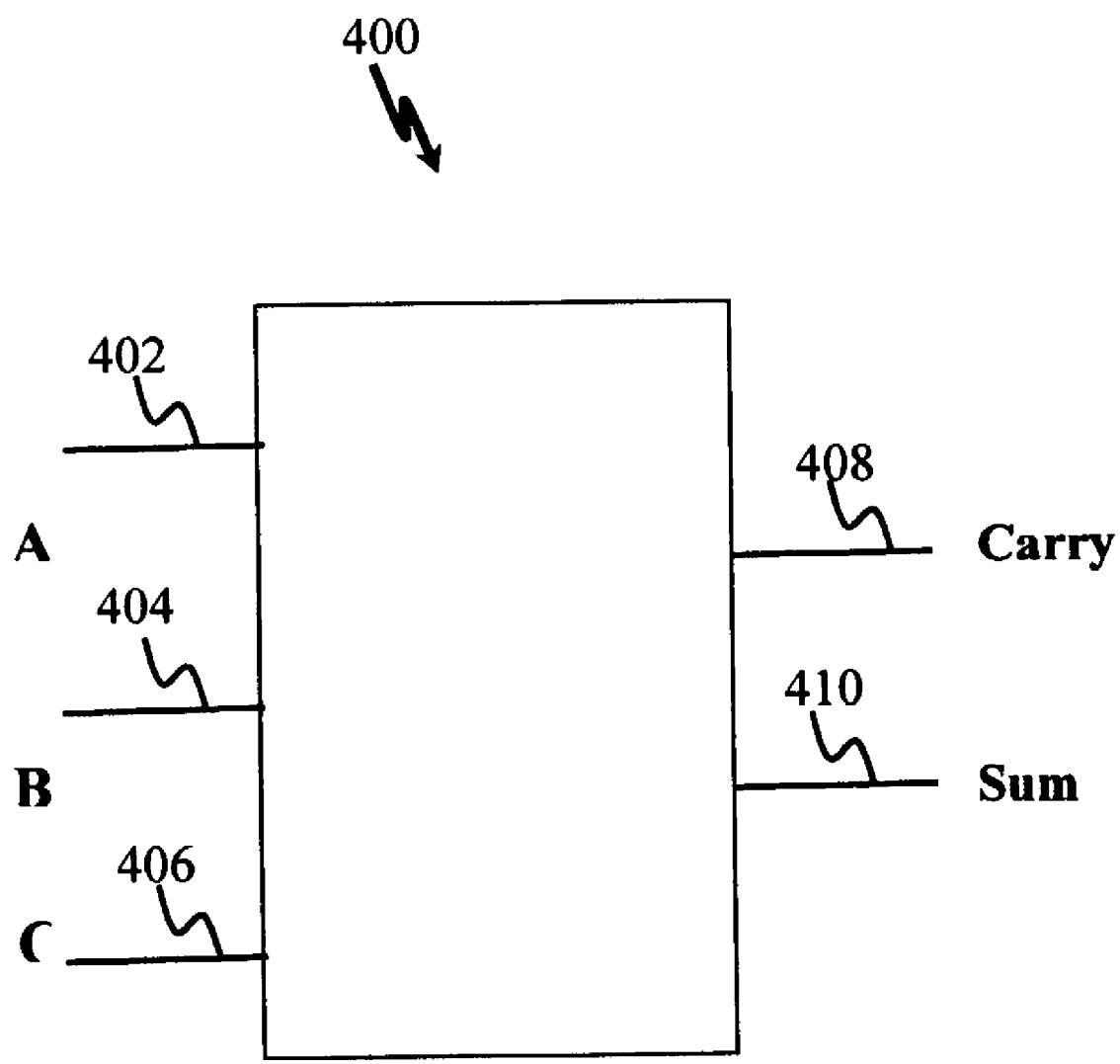
FIG. 4(*a*) is a block diagram representing an implementation of a 3:2 compressor.

FIG. 4(a) shows a known implementation of a 3:2 compressor 400 using a full adder. The 3:2 compressor 400 receives three inputs A-402, B-404 and C-406 and produces a sum 408 and a carry 410.

FIG. 4(b) shows the truth table for the 3:2 compressor 400 of FIG. 4(a). It is evident from the truth table 415 that the sum 408 and the carry 410 together provide the sum A+B+C. For example, if one of the three inputs A,B,C is equal to 1, with the other inputs being 0, the carry is 0 and the sum is 1, representing a result of 1.

Similarly, if two of the inputs are 1 with the remaining input being 0, the carry is 1 and the sum is 0, yielding a result of 2. Finally, if each of the inputs is 1, the carry is 1 and the sum is 1, representing a result of 3. Thus, the 3:2 compressor 400 is able to represent the values of the three inputs 402, 404 and 406 in the carry-save format using two components 408 and 410.

Figure 4C:
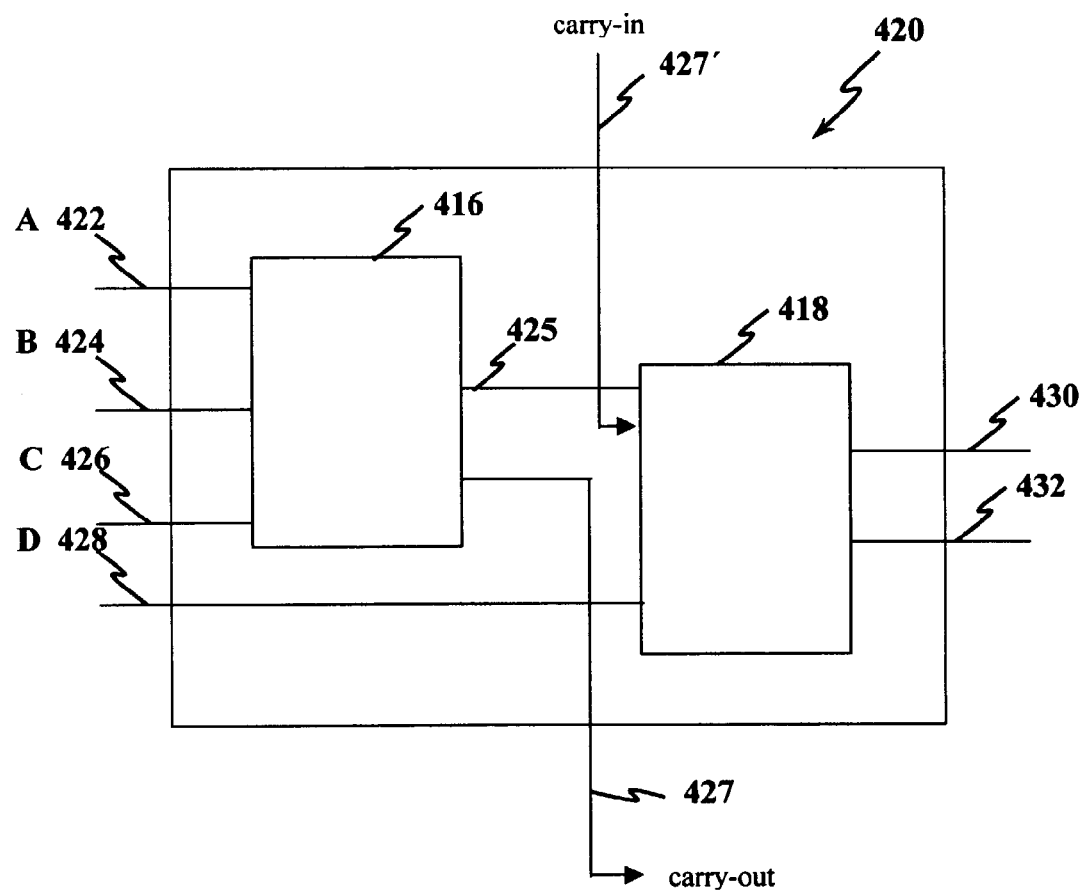

FIG. 4(c) shows a known implementation of a 4:2 compressor 420 using two full 3:2 adders 416, 418, which have been cascaded. Four inputs 422, 424, 426 and 428 are presented to the 4:2 compressor 420, which produces carry and sum outputs 430 and 432, respectively. Three inputs 422, 424 and 426 are presented to the first full adder 416. The first full adder 416 produces a sum 425 and a carry 427, and the sum 425 only is presented to the second full adder 418. The carry 427 from previous processing is input to the second full adder 418. The second full adder 418 also receives the fourth input 428 and produces a sum 430 and a carry 432. The carry 430 and sum 432 represent the sum of the four inputs 422, 424, 426 and 428.

Calculating Normalization Values with Carry-Save Arithmetic

Figure 5:
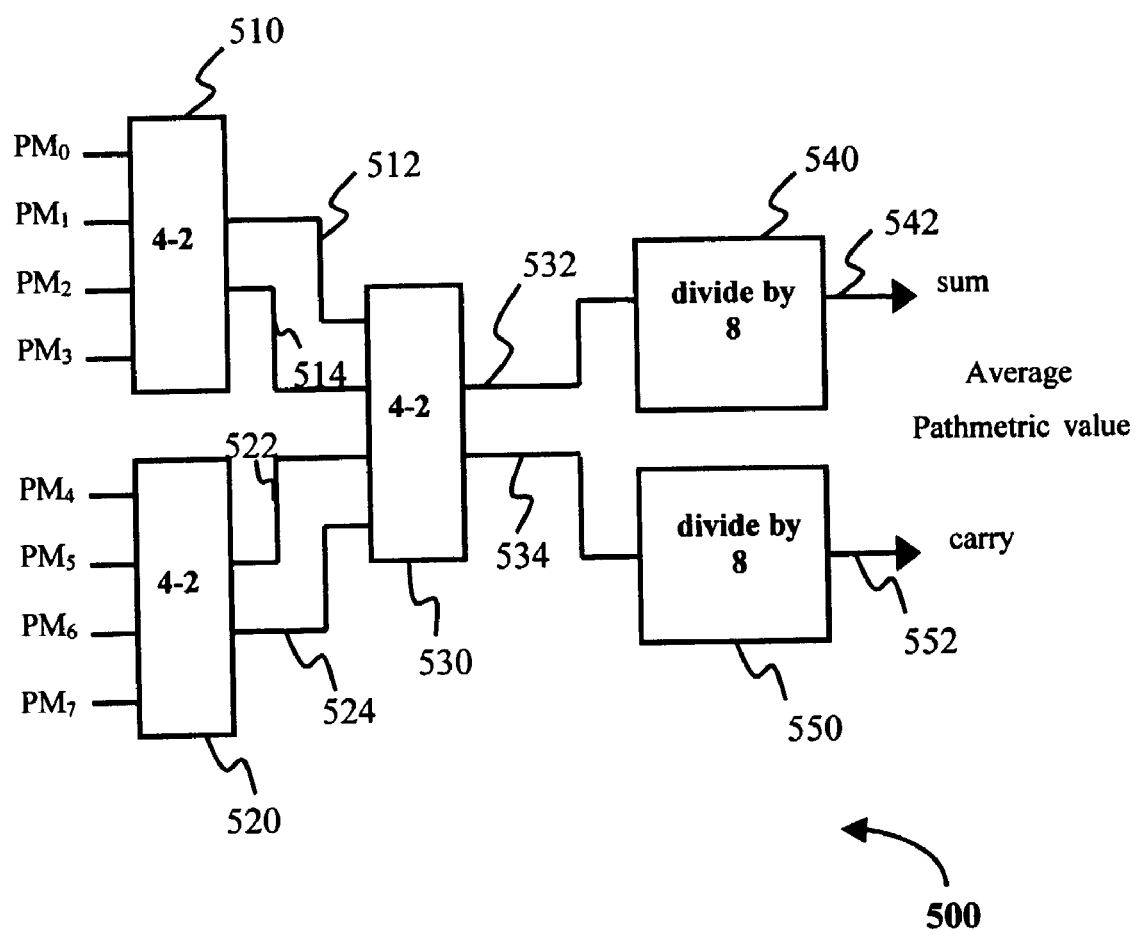
FIG. 5 is a representation of an average path metric normalization circuit.

FIG. 5 illustrates a carry-save compressor tree 500 used to compute an average value of the path metrics for use in normalization in accordance with an embodiment of the invention.

Normalization of the path metrics in a trellis algorithm is done to prevent overflow and to limit the dynamic range of the variables. Conventionally, either the maximum or minimum path metric is found across all the states, and then, in the next cycle, that value is subtracted from all the states to limit how much the path metrics grow. In a high-speed implementation, computing the maximum or minimum value requires a comparator tree as previously described with reference to FIGS. 3(a) and 3(b).

The normalization scheme for the ACS butterfly relies on the average value of the path metrics $PM_0 \ldots PM_7$. A first 4:2 compressor 510 accepts path metrics $PM_0$ to $PM_3$ and outputs intermediate values 512 and 514. Similarly, a second 4:2 compressor 520 accepts path metrics $PM_4$ to $PM_7$ and outputs corresponding intermediate values 522 and 524. These intermediate values 512, 514, 522 and 544 are input to a third 4:2 compressor 530, which calculates the final sum of all the input path metrics PM0 to PM7, in sum, and carry components 532 and 534. These components 532 and 534 are passed through respective divisor blocks 540 and 550 to divide by the number of path metrics that, in this illustrative example, is 8. The average of the path metrics $PM_0$ to $PM_7$ is then output in its sum and carry components 542 and 552. As the number of path metrics is conveniently a power of two, the division can be performed by logical right shifting the binary representation of the components 532 and 534 by the appropriate number of bits, in this case 3.

The average path metric value can be computed in this way faster than the maximum or minimum normalization values calculated as described earlier with reference to FIGS. 3(a) and 3(b).

It is recognized that the normalization has no intrinsic effect on the performance of the algorithm, and is simply used to limit the dynamic range of the path metric values. Therefore, average value normalization can be implemented without adverse effect.

Path Metric Processing in ACS Unit

Figure 6:
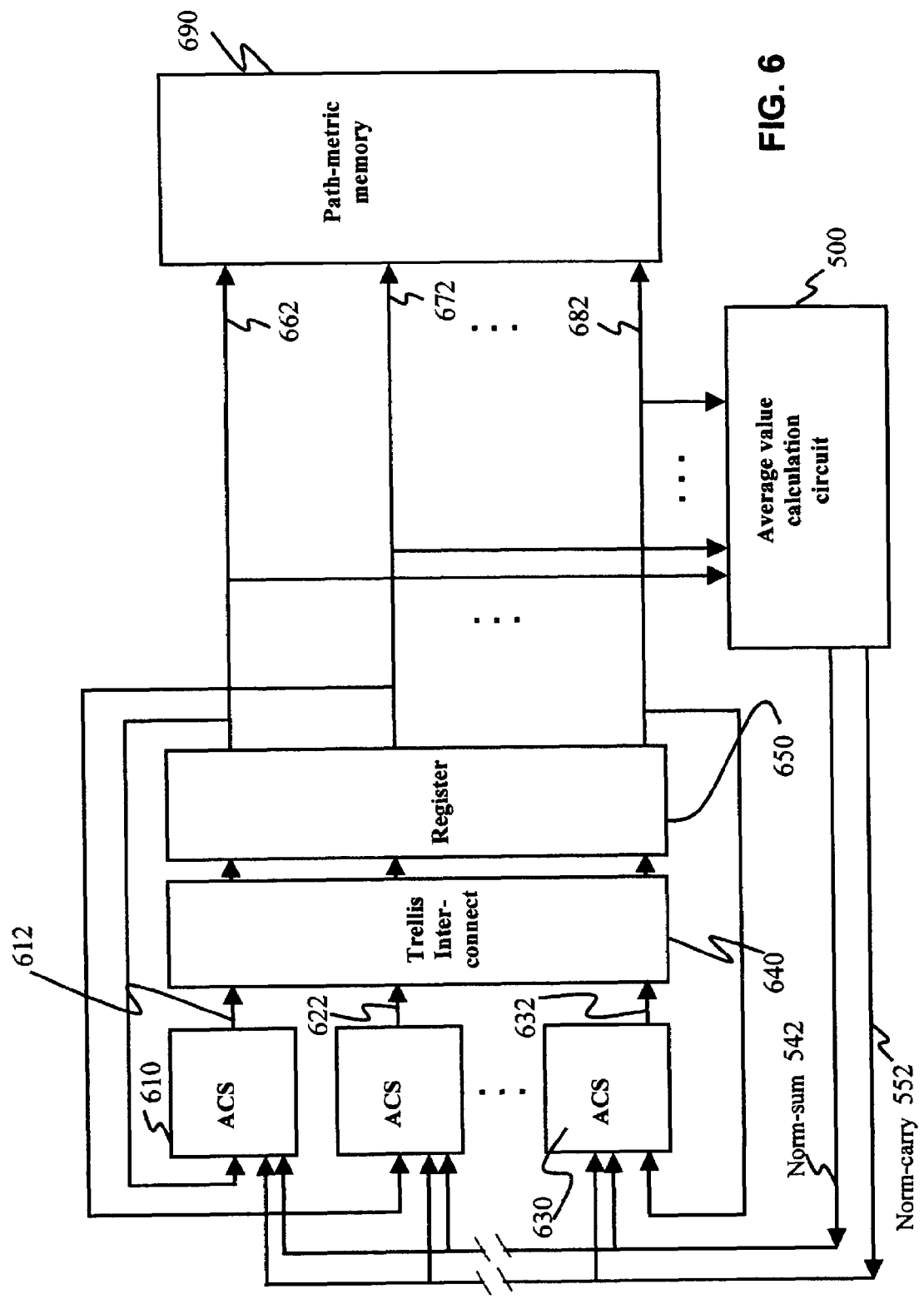
FIG. 6 is a representation of circuitry for calculating state probabilities, in which the path metric values can be updated using the normalization circuit of FIG. 5.

FIG. 6 illustrates a schematic representation of circuitry for calculating state probabilities, in which the path metric values are updated using the normalization circuit of FIG. 5. A number of conventional ACS units 610, 620, . . ., 630, provided in accordance with FIG. 2, are included as shown. A first ACS unit 610 produces a corresponding path metric 612. Similarly, a second ACS unit 620 produces a path metric 622, and an "n-th" ACS unit 630 produces a path metric 632.

The individual path metrics 612, 622, 632 are presented to a trellis interconnect 640 and thence to a register 650, before being presented as corresponding path metrics 662, 672 and 682. Each of the path metrics 662, 672 and 682 is presented to a path metric memory 690. The path metrics 662, 672 and 682 are also presented as recursive inputs to the respective ACS units 610, 620 and 630.

In accordance with an embodiment, the average path metric normalization circuit 500, as earlier described, takes as input the various path metrics 662, 672, 682 and provides an average value of the path metrics 662, 672 and 682 in unresolved sum and carry components 542 and 552, respectively. The sum and carry components 542, 552 are presented to each of the ACS units 610, 620, . . . , 630 to be used in the normalization of path metrics produced in a next iteration.

Implementation of Normalization Scheme

Figure 7A:
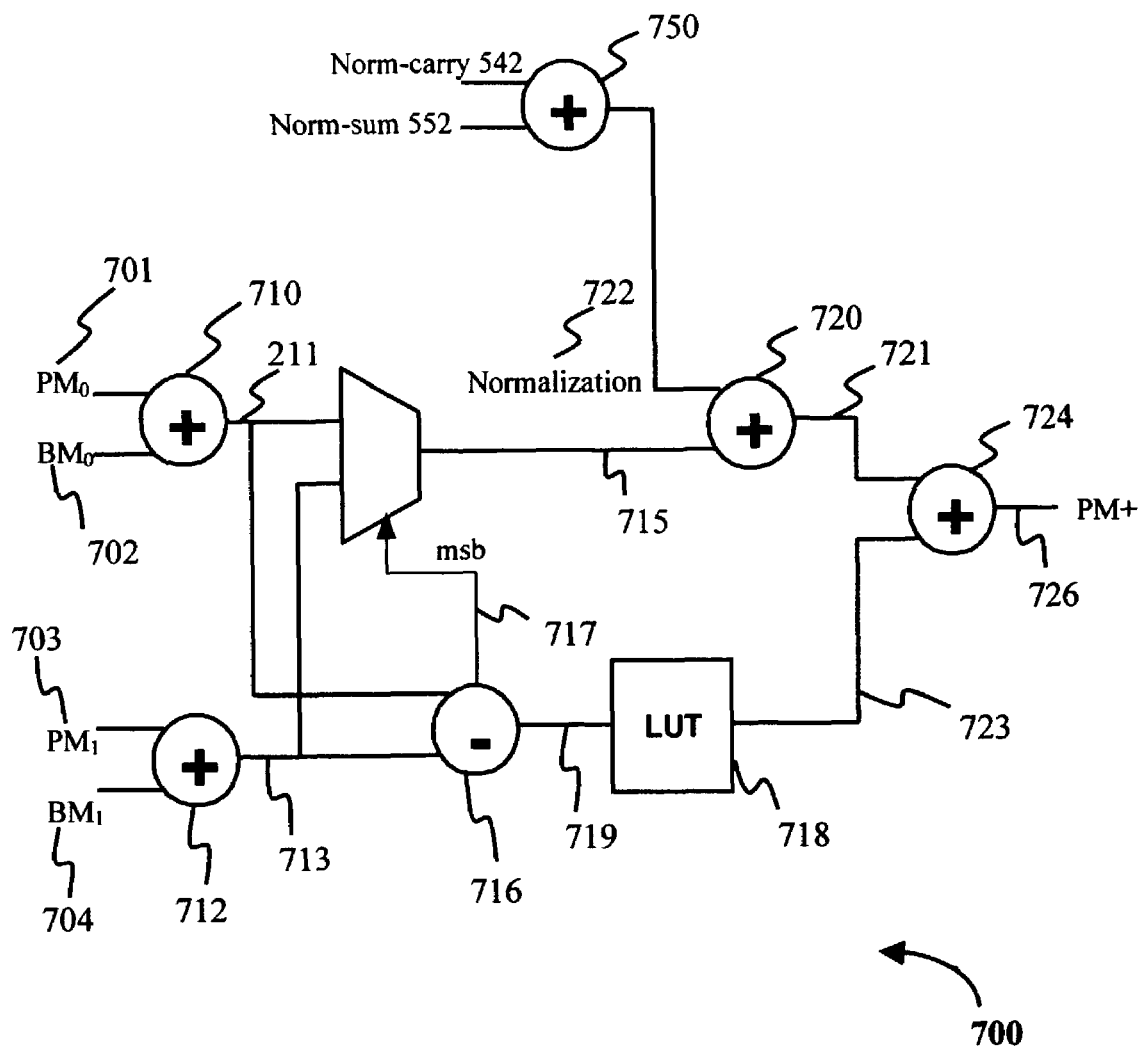
FIGS. 7(*a*) and 7(*b*) are representations of an ACS processing unit using circuitry of FIG. 6.
Figure 7B:
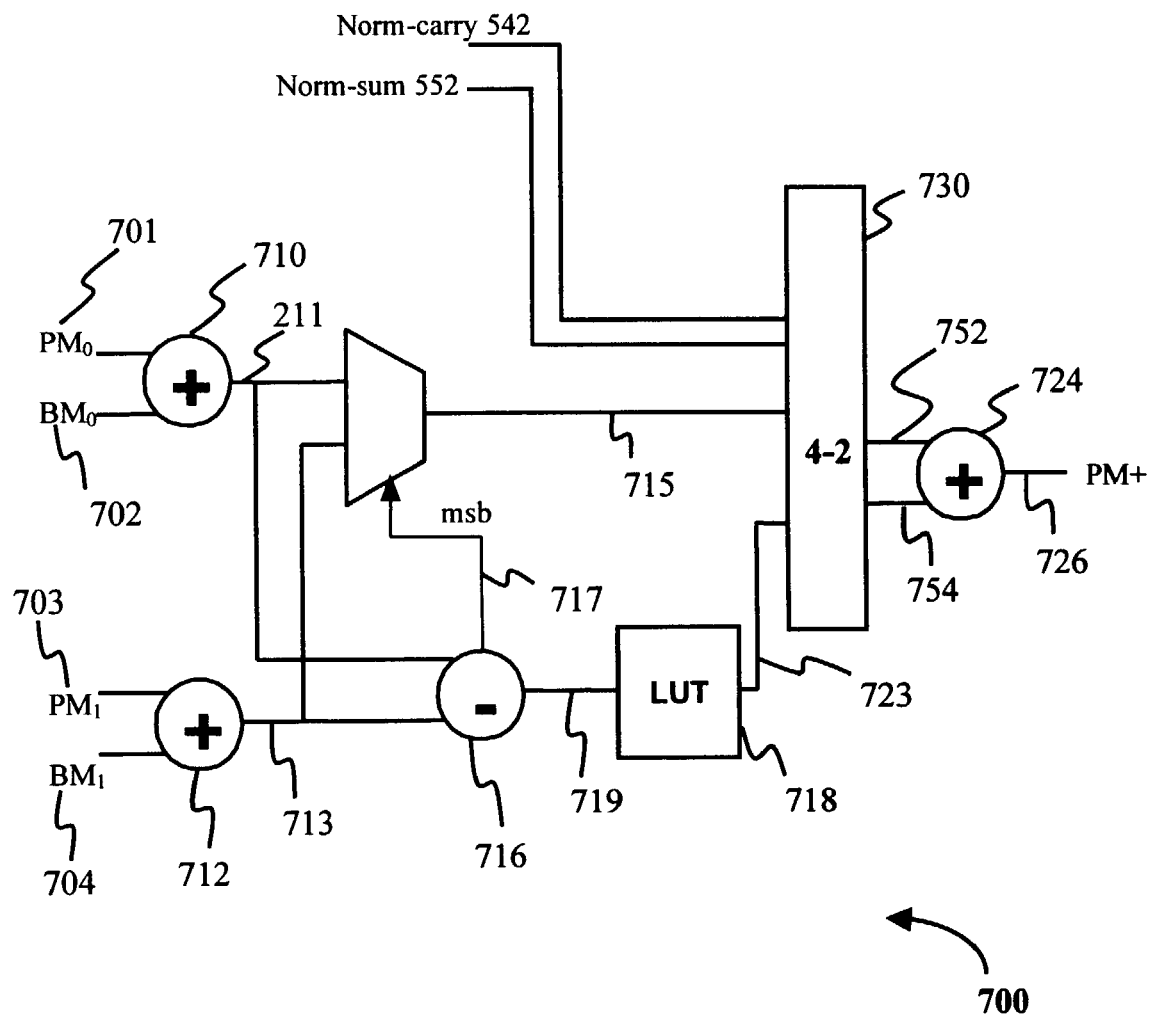

FIG. 7(*a*) is a schematic representation of an ACS unit 700 similar to that of FIG. 2 but where corresponding components are indicated with corresponding reference numerals elevated by the value 500. The ACS unit 700 operates entirely analogously to that of the ACS unit 200 of FIG. 2, but with one difference. The unresolved normalization value (in sum and carry components 542, 552) is provided to an adder 750, which resolves these components into a resolved normalization value 722 for use in the ACS unit 700.

FIG. 7(*b*) shows an alternate embodiment of the ACS unit 700 of FIG. 7(*a*), in which a single 4:2 compressor 730 replaces the adders 750, 720 and 724 of FIG. 7(*a*). The 4:2 compressor 730 receives as inputs the normalization sum and carry components 542 and 552, respectively, the maximum path metric 715 and the corrective factor 723 to produce a new path metric in sum and carry components 752 and 754. The new path metric sum and carry components 752 and 754 are presented to an adder 724 which resolves the constituent components into a resolved new path metric PM+ 726.

Average Value Normalization Performance

The average value normalization is a viable solution for single-cycle normalization. In many implementations, the maximum comparator tree calculates its result much too slow for a single-cycle normalization operation. Single cycle normalization can further reduce the dynamic range of the variables, and contribute to power savings due to reduced memory size. Power savings can be of significant advantage for some applications, as the requirements for wireless communications hardware may often dictate low power consumption.

In short, a method of path metric normalization that uses the average path metric value can be computed much quicker than a corresponding maximum or minimum value and, as a result, can be used on every cycle for normalization.

While the particular invention has been described with reference to illustrative embodiments, this description is not meant to be construed in a limiting sense. It is understood that although the present invention has been described, various modifications of the illustrative embodiments, as well as additional embodiments of the invention, will be apparent to one of ordinary skill in the art upon reference to this description without departing from the spirit of the invention, as recited in the claims appended hereto. Consequently, the method, system and portions thereof and of the described method and system may be implemented in different locations, such as a wireless unit, a base station, a base station controller, a mobile switching center and/or a radar system. Moreover, processing circuitry required to implement and use the described system may be implemented in application specific integrated circuits, software-driven processing circuitry, firmware, programmable logic devices, hardware, discrete components or arrangements of the above components as would be understood by one of ordinary skill in the art with the benefit of this disclosure. Those skilled in the art will readily recognize that these and various other modifications, arrangements and methods can be made to the present invention without strictly following the exemplary applications illustrated and described herein and without departing from the spirit and scope of the present invention It is therefore contemplated that the appended claims will cover any such modifications or embodiments as fall within the true scope of the invention.

The invention claimed is:

1. A method of path metric normalization comprising:
   determining a normalization value by calculating, in a carry-save format, an average of values for at least two different path metrics during at least one trellis processing step, the calculating the average value including calculating a final sum of the at least two different path metrics using a plurality of four input, two output compressor units, and dividing the final sum using a plurality of divisor blocks; and
   normalizing the values for the at least two different path metrics with the normalization value, the normalization value is calculated for a first time index cycle and being used to normalize the path metric values for a second time index cycle.

2. The method of claim 1, wherein the dividing the final sum comprises:
   right shifting a binary representation of the sum of the path metric values by a number of states, the number of states =n, wherein $2^n$=a number of the different path metrics.

3. The method of claim 1, wherein the step of calculating the average of the path metric values comprises generating the average in unresolved sum and carry components.

4. The method of claim 3, wherein at least one of i) the normalization value is determined each first time index cycle and ii) the normalization value is used to normalize the path metric values each second time index cycle.

5. A trellis processor having a number of states and associated path metric values, comprising:
   a calculator determining a normalization value by calculating, in a carry-save format, an average of values for at least two different path metrics, the calculator includes;
   a plurality of four input, two output compressor units to calculate a final sum of the at least two different path metrics, and
   a plurality of divisor blocks dividing the final sum to caluculate the average value; and
   a normalization processor normalizing the values for the at least two different path metrics with the normalization value, the normalization value is calculated for a first time index cycle and being used to normalize the path metric values for a second time index cycle.

6. The trellis processor of claim 5, wherein the plurality of divisor blocks includes at least two registers for storing a binary representation of the sum of the path metric values.

7. The trellis processor of claim 6, wherein the plurality of divisor blocks right shifts the binary representation of the sum of the path metric values by a number of states, the number of states =n, wherein $2^n$=a number of the different path metrics.

8. An apparatus for trellis processing includes:
   means for determining a normalization value by calculating, in a carry-save format, an average of values for at least a number of different path metrics, the determination means including means for calculating a final sum of the at least two different path metrics using a plurality of four input, two output compressor units, and means for dividing the final sum using a plurality of divisor blocks to calculate the average value; and
   means for normalizing the path metric values with the normalization value, the normalization value is calculated for a first time index cycle and being used to normalize path metric values for a second time index cycle.

9. The apparatus of claim 8, wherein the dividing means right shifts a binary representation of the sum of the path metric values to determine said normalization value by a number of states, the number of states=n, wherein $2^n$=a number of the different path metrics.

10. The apparatus of claim 8, wherein the calculated average of the path metric values is generated in unresolved sum and carry components.

11. The apparatus of claim 8, wherein i) the normalization value is determined each first time index cycle and ii) the normalization value is used to normalize the path metric values each second time index cycle.

* * * * *